(12) United States Patent
Ham

(10) Patent No.: US 10,690,734 B2
(45) Date of Patent: Jun. 23, 2020

(54) MAGNETIC RESONANCE EXAMINATION SYSTEM WITH FLUID COOLING ARRANGEMENT

(71) Applicant: KONINKLIJKE PHILIPS N.V., Eindhoven (NL)

(72) Inventor: Cornelis Leonardus Gerardus Ham, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 99 days.

(21) Appl. No.: 15/772,674

(22) PCT Filed: Oct. 28, 2016

(86) PCT No.: PCT/EP2016/076037
§ 371 (c)(1),
(2) Date: May 1, 2018

(87) PCT Pub. No.: WO2017/080845
PCT Pub. Date: May 18, 2017

(65) Prior Publication Data
US 2019/0154772 A1   May 23, 2019

(30) Foreign Application Priority Data

Nov. 9, 2015   (EP) .................................... 15193700

(51) Int. Cl.
*G01R 33/28*     (2006.01)
*H01F 6/04*      (2006.01)
(Continued)

(52) U.S. Cl.
CPC ..... *G01R 33/3403* (2013.01); *G01R 33/3804* (2013.01); *G01R 33/3815* (2013.01);
(Continued)

(58) Field of Classification Search
CPC .... G01R 33/34; G01R 33/3403; G01R 33/38; G01R 33/3815; G01R 33/3856; G01R 33/3804; G01R 33/28; H01F 6/04
See application file for complete search history.

(56) References Cited

U.S. PATENT DOCUMENTS

2002/0148604 A1   10/2002   Emeric et al.
2005/0035764 A1    2/2005   Mantone et al.
(Continued)

FOREIGN PATENT DOCUMENTS

| GB | 2431981 A    | 5/2007 |
| JP | 2013180094 A | 9/2013 |
| WO | 2015071795 A1 | 5/2015 |

*Primary Examiner* — Son T Le

(57) ABSTRACT

A magnetic resonance examination system comprises cooling clients (113, 144, 115) from which heat is carried-off by way of a system cooling circuit. A heat source (109) is in thermal contact with the system cooling circuit. A main pump (107) drives flow of the coolant in the system cooling circuit. The coolant is kept in motion and may be heated by the heat source. Thus, freezing of the coolant is avoided without the need of antifreeze. A back-up pump (121) of lower performance requirements may maintain flow of the coolant even if the main pump fails. A low viscosity coolant, such as water may be used. The system also contains a shut-off valve (127) and a short-circuit (141) parallel to the shut-off valve.

9 Claims, 4 Drawing Sheets

(51) Int. Cl.
*G01R 33/34* (2006.01)
*G01R 33/38* (2006.01)
*G01R 33/385* (2006.01)
*G01R 33/3815* (2006.01)

(52) U.S. Cl.
CPC ........... *G01R 33/3856* (2013.01); *H01F 6/04* (2013.01); *G01R 33/28* (2013.01)

(56) References Cited

U.S. PATENT DOCUMENTS

| | | |
|---|---|---|
| 2009/0071626 A1 | 3/2009 | Li et al. |
| 2009/0128269 A1 | 5/2009 | Seeber et al. |
| 2012/0196753 A1 | 8/2012 | Laskaris et al. |
| 2013/0089435 A1 | 4/2013 | Graessner et al. |
| 2014/0203809 A1 | 7/2014 | Tanaka et al. |
| 2016/0120059 A1* | 4/2016 | Shedd .................... H05K 7/208 165/244 |

* cited by examiner

MAGNETIC RESONANCE EXAMINATION SYSTEM WITH FLUID COOLING ARRANGEMENT

CROSS REFERENCE TO RELATED APPLICATIONS

This application is a U.S. national phase application of International Application No. PCT/EP2016/076037, filed on Oct. 28, 2016, which claims the benefit of EP Application Serial No. 15193700.0 filed on Nov. 9, 2015 and is incorporated herein by reference.

FIELD OF THE INVENTION

The invention pertains to a magnetic resonance examination system with a cooling arrangement to remove heat from components of the magnetic resonance examination system during operation.

Magnetic resonance imaging (MRI) methods utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MRI method in general, the body of the patient to be examined is arranged in a strong, uniform magnetic field B0 whose direction at the same time defines an axis (normally the z-axis) of the co-ordinate system to which the measurement is related. The magnetic field B0 causes different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field B1 of this RF pulse extends perpendicular to the z-axis, so that the magnetization performs a precession motion about the z-axis. The precession motion describes a surface of a cone whose angle of aperture is referred to as flip angle. The magnitude of the flip angle is dependent on the strength and the duration of the applied electromagnetic pulse. In the example of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant T1 (spin lattice or longitudinal relaxation time), and the magnetization in the direction perpendicular to the z-direction relaxes with a second and shorter time constant T2 (spin-spin or transverse relaxation time). The transverse magnetization and its variation can be detected by means of receiving RF antennae (coil arrays) which are arranged and oriented within an examination volume of the magnetic resonance examination system in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution in the subject being imaged, such as a patient to be examined, constant magnetic field gradients extending along the three main axes are superposed on the uniform magnetic field B0, leading to a linear spatial dependency of the spin resonance frequency. The signal picked up in the receiving antennae (coil arrays) then contains components of different frequencies which can be associated with different locations in the body. The signal data obtained via the receiving coils correspond to the spatial frequency domain of the wave-vectors of the magnetic resonance signal and are called k-space data. The k-space data usually include multiple lines acquired of different phase encoding. Each line is digitized by collecting a number of samples. A set of k-space data is converted to an MR image by means of Fourier transformation.

The transverse magnetization dephases also in presence of constant magnetic field gradients. This process can be reversed, similar to the formation of RF induced (spin) echoes, by appropriate gradient reversal forming a so-called gradient echo. However, in case of a gradient echo, effects of main field inhomogeneities, chemical shift and other off-resonances effects are not refocused, in contrast to the RF refocused (spin) echo.

BACKGROUND OF THE INVENTION

Such a magnetic resonance examination system is known from the US-patent application US2002/0148604.

The known magnetic resonance examination system is provided with a system of removing heat from an MR imaging device to maintain internal temperatures below maximum operating limits. A heat exchanger, coolant pump and a controller are provided to regulate the temperature of the coolant to dissipate heat form the gradient coils.

SUMMARY OF THE INVENTION

An object of the present invention is to provide a magnetic resonance examination system with a simpler system cooling circuit to carry-off heat from a cooling client, such as a gradient coil.

This object is achieved in the magnetic resonance examination system comprising
  a cooling client;
  a system cooling circuit in thermal correspondence with the cooling client and in thermal correspondence with a heat drain; including
  a main pump arranged in the system cooling circuit to drive fluid flow in the system cooling circuit wherein
  a heat source is arranged in thermal correspondence with the system cooling circuit.

The magnetic resonance examination system includes several components that need to be cooled, e.g. to maintain the component at its optimum operating temperature, in that heat generated by these components during operation needs to be carried-off. These components are termed cooling clients in the framework of the present invention. Examples of these components that need to be cooled are gradient coils, gradient amplifiers or radio frequency (RF) amplifiers of the magnetic resonance examination system. The heat generated by these components is carried-off to a heat drain. Ambient (outside or outdoor) air is often a sufficient heat drain in that heat from the cooling clients can be carried-off to outside air. In order to carry-off heat from the cooling client(s), a cooling arrangement with a system cooling circuit with a back-end cooling fluid is provided in thermal correspondence with the cooling client. The cooling arrangement operates on the basis of a circulating coolant, such as a cooling fluid e.g. a cooling liquid which takes up heat from the cooling clients and dissipates heat at the heat drain. Thus, the back-end cooling fluid takes-up excess heat from the cooling clients. The cooling fluid in the system cooling circuit is in normal operation kept in motion by the main pump. The main pump typically operates at high flow of about 100 l/min, high pressure of 2-3 bar and has a power of 2-3 kW. According to the invention a heat source is provided in thermal correspondence with the system cooling circuit. When the temperature of the back-end cooling fluid is below a pre-set limit, preferably slightly higher than the freezing point of the back-end cooling fluid, then the cooling arrangement is set such that the heat source transfers heat to the back-end cooling fluid. This can be achieved e.g. when the heat source is in a fixed thermal correspondence with the system cooling circuit, by switching the heat source on. Alternatively, the heat source may operate continuously and when the temperature of the back-end cooling fluid drops below the pre-set limit, then the thermal coupling of the heat source to the system cooling circuit is adjusted or switched-on so that is transfer sufficient heat to the back-end cooling fluid. In a practical example, the cryocooler which is also a cooling client of which heat needs to be carried-off, functions as the heat source. The particular property of the cryocooler is that it is always on (as long as the main magnet coils are maintained in their superconducting state), and always produces heat which can be employed to prevent freezing of the back-end cooling fluid. The cooling clients, notably the cryocooler and other cooling clients such as the gradient coil, gradient amplifier and radio frequency amplifier are served by the same system cooling circuit. As explained in detail in the sequel, water can be used as coolant in the system cooling system. Thus, the heat provided by the heat source in addition to heat taken up (if any) from the cooling client(s) avoids freezing of the back-end cooling fluid so that cooling of the cooling clients is available even at low temperatures near the freezing point of the back-end cooling fluid. In this way it is achieved that the system cooling circuit may be partly outside of the building, or be at least in thermal correspondence with the heat drain, e.g. formed by outside air into which the heat carried-off is dissipated. Preferably, equipment that is available in the magnetic resonance examination system for another function of the magnetic resonance examination system and which produces heat can be employed as the heat source. The function of the heat source can be performed by a Helium-compressor of the magnetic resonance examination system's cryocooler. The cryocooler's function is to cool and liquefy Helium that is then employed to cool the magnetic resonance examination system's main magnet windings below their critical temperature for superconductivity. As the He-compressor will be active in almost all operational modes, even in a stand-by mode in which the magnetic resonance examination system does not acquire image data, the He-compressor will in almost all operational modes produce some amount of heat. This heat is applied according to the invention to the back-end cooling fluid to prevent it from freezing and avoid the need for anti-freeze.

Because the magnetic resonance examination system's cooling arrangement does not require anti-freeze in the system cooling circuit, a relatively low viscosity cooling fluid can be employed, so that a relatively low pressure main pump can be employed. Because the invention ensures that the back-end cooling fluid is kept in motion, and can take up some heat from the heat source, the risk of freezing, e.g. at very low outside temperature near the back-end cooling fluid's freezing point, is made very low or is even eliminated. Hence, no additional technical measures such as the use of anti-freeze are required. In this way a relatively simple cooling arrangement is provided. Further, a cooling fluid having a relatively high heat capacity cooling fluid, such as water, can be employed, which is more efficient in transporting heat away from the cooling client(s). An insight of the present invention is that within the magnetic resonance examination system there generally is some form of heat production, notably by the He-compressor of the cryocooler, which may form the heat source, is available even when the magnetic resonance examination system in in the stand-by mode in which no MR image data acquisition take place. It is sufficient to establish a thermal correspondence between the back-end cooling fluid and the heat source to, in combination with flow of the back-end cooling fluid, prevent freezing of the back-end cooling fluid. That is even if ambient temperature at the heat drain, such as outside air, is close to or below the freezing point of the back-end cooling fluid, freezing is avoided and the system cooling system remains functional. A further insight of the present invention is that anti-freeze is generally based on a solution of (ethylene or propylene)glycol in water. Such an antifreeze has a higher viscosity and lower heat capacity than water, so that efficiency of heat transport is lower. Thus, antifreeze can be avoided and the invention enables efficient cooling at a low pumping pressure. Also relatively narrow cooling channels can be employed that take-up relatively little space in the magnetic resonance examination system. In practice, cooling channels of 4-10 mm diameter are suitable. As narrow cooling channels can be employed, the cooling channels leave sufficient room for the electrically conducting, e.g. copper, windings of the gradient coil.

In brief, the magnetic resonance examination system of the present invention comprises cooling clients from which heat is carried-off by way of a system cooling circuit. A heat source, e.g. formed by one of the cooling clients, such as the cry-cooler is in thermal contact with the system cooling circuit. A main pump drives flow of the coolant in the system cooling circuit. The coolant is kept in motion and may be heated by the heat source. Thus, freezing of the coolant is avoided without the need of antifreeze. A back-up pump of lower performance requirements may maintain flow of the coolant even if the main pump fails. A low viscosity coolant, such as water may be used.

These and other aspects of the invention will be further elaborated with reference to the embodiments defined in the dependent Claims.

In an embodiment of the invention, a system back-up pump is provided to ensure to keep the cooling fluid in the system cooling circuit in motion even if the main pump fails. The system back-up pump is circuited in parallel to the main pump. The back-up pump may have a comparatively low performance, in that the back-up pump operates at a comparatively low pressure and low fluid flow such as 10 l/min at 0.3 bar. In the event of failure of the back-up pump, the main pump may keep the back-end cooling fluid flowing and take up heat from the heat source, so that freezing is avoided. The back-up pump adds further to more robust operation of the cooling arrangement. Additionally, electrical power consumption is further reduced in the magnetic resonance examination system's stand-by mode because the main pump does not need to operate. This further extends the operational life-time of the main pump. In the event of failure of the main pump, the back-up pump is able to sustain flow of the back-end cooling fluid, albeit, depending on the back-up pump performance, the magnetic resonance examination system remaining in its stand-by mode. Alternatively, the back-up pump may be identical or have similar performance to the main pump to form a full functional back-up to of the main pump.

Preferably, the back-up pump has a limited performance that is sufficient to sustain flow of back-end cooling fluid to the heat source, e.g. the He-compressor of the cryocooler. This would be achieved by a low flow of 10 l/min, much lower that the flow generated by the main pump of about 100 l/min. Preferably, when the back-end cooling fluid is kept in motion by the back-up pump only, then the magnetic resonance examination system remains in its standby-mode and no back-end cooling fluid is led past the cooling clients. This improves robustness against freezing of the back-end cooling fluid, even during prolonged duration of the stand-by mode.

Preferably, the back-up pump is configured in parallel to the main pump in the system cooling circuit. A non-return valve when closed shuts-off the back-end cooling fluid from a return fluid path via the main pump. The non-return valve's function is to prevent the back-end cooling fluid flow along an undesired fluid path. Closing of the non-return valve ensures that the back-end cooling fluid continues to pass to the cooling client(s). Optionally further back-up pumps each associated with its no-return valve may ensure that the back-end cooling fluid continues to reach the cooling client(s). Thus, even in the event of the main pump being not operable, whether due to it being switched-off or due to failure, unidirectional fluid flow is maintained in the system cooling circuit. In the event the main pump does not operate, the no-return-valve prevents the back-end cooling fluid to flow in reverse to via the main pump. In a similar way there is a non-return valve at the back-up pump to prevent reverse flow via the back-up pump, when the main pump is running.

In a further embodiment a separate back-up heater may be provided for the system cooling circuit. This can avoid freezing of the back-end cooling fluid at low temperatures just above its freezing point, even if other heat sources in thermal correspondence with the system cooling circuit do not operate, either as they are switched-off or malfunction.

In a further embodiment of the invention a chiller is included. The chiller includes a chiller's cooling circuit in which a front-end cooling fluid is made to expand to cool the front-end cooling fluid, and take up heat as the front-end fluid expands or vaporizes and compress the front-end cooling liquid and when it is compressed or condenses gives-off heat to the heat drain, e.g. outside air. That is, usually the front-end cooling fluid expands as a gas or vapour which subsequently condenses into a liquid. A heat exchanger is arranged between the system cooling circuit and a chiller's cooling circuit to transfer heat from the system cooling circuit to the chiller's cooling circuit from which the heat is finally carried-off to the heat drain, such as to the outside air (outside of a building in which the magnetic resonance examination system is sited). The front-end cooling liquid is preferably a Freon-type or HFK-type having a high specific heat capacity. The present invention reduces the risk of freezing of the back-end cooling fluid and hence does not require intermediate equipment, such as an additional liquid cooling cabinet between the chiller and the system cooling circuit.

In another embodiment of the invention, the system cooling circuit includes (a) shut-off valve(s) which may be arranged upstream or downstream of the cooling client(s) such that when the shut-off valve(s) are closed, flow of back-end cooling liquid the cooling client(s), other than the cryocooler, is stopped. The shut-off valve ensures a minimum flow to the heat source, e.g. to the He-compressor of the cryocooler. When the magnetic resonance examination system is switched into its stand-by mode the shut-off valve to its cooling client is closed. Then, less fluid needs to circulate and only a lower performance pump, notably the system back-up pump is sufficient to maintain circulation in the system cooling circuit. This counteracts freezing of the back-end cooling fluid when its temperature decreases to its freezing point.

In a further embodiment of the invention, the system cooling system includes a short-circuit parallel to the shut-off valve and the short-circuit is in thermal correspondence with the heat source. The short-circuit ensures that back-end cooling fluid is supplied to the heat source, whatever the state of the shut-off valve.

In a further embodiment of the invention, the back-end cooling fluid is a low viscosity fluid, e.g. water. This requires only a low-pressure to pump and maintain a fluid low in the system cooling circuit. Further, the back-end cooling fluid may be have a high heat capacity, such as water, which provides to carry-off heat from the heating client(s) at a high efficiency even at a moderate flow.

As the system back-up pump(s) (have comparatively low power as compared to the main pump, in the stand-by mode the magnetic resonance examination system has a lower power consumption for the cooling function.

The invention also pertains to a method of operating the cooling of the cooling clients in an magnetic resonance examination system. In the framework of the present invention, the magnetic resonance examination system has a stand-by mode in which no MR image data are acquired. The magnetic resonance examination system has also an imaging mode in which magnetic resonance signal are generated and acquired. In the imaging mode cooling clients, such as the gradient amplifier, gradient coil(s) and the RF amplifier draw electrical power and to have generated by its operation to be carried-off. The imaging mode may as well include a 'ready-to-scan' mode in which no actual magnetic resonance signal are yet generated or acquired, but the magnetic resonance examination system prepares for the generation and acquisition of the magnetic resonance signals.

In the imaging mode the main pump is switched on to sustain a fluid flow in the system cooling circuit to carry-off heat from the cooling clients that are generally in operation in the imaging mode. In the stand-by mode, the cooling clients are generally not active, so that the main pump may be switched-off and the back-up pump switched on to sustain the fluid low in the system cooling circuit. In the stand-by mode the heat source, such as the Helium compressor, is generally active and produces heat. The fluid flow in the system cooling circuit then takes up heat from the heat source and freezing of the system cooling circuit is avoided. In the stand-by mode, as the cooling clients do not need to be cooled and the shut-off valve may be closed so that back-end cooling fluid is passed only along the heat source. That is, the shut-off valve is open in imaging mode and closed in stand-by mode.

In an example of the method of the invention, a heat fault mode may occur in which the heat source, e.g. the Helium compressor, may fail. In such a heat fault mode the main pump is switched-on even if the magnetic resonance examination system is in its stand-by mode. Then, the operation of the main pump will produces enough heat and fluid flow to avoid freezing of the system cooling circuit. Optionally also one of the cooling clients (e.g. gradient amplifier) is switched on to provide heat to avoid freezing of the system cooling circuit.

In a further example of the method of the invention, in the event of failure of the system back-up pump, i.e. a back-up fault mode, the magnetic resonance examination system is switched from its stand-by mode to its imaging mode in which the main pump is switched on, and optionally one or more cooling clients are activated to produce sufficient heat to avoid freezing of the system cooling circuit. This may be implemented in that in the event the back-up pump fails, the cooling system is operated in the imaging mode. In another implementation a separate back-up heater is switched on the heat fault mode to produce an amount of heat to avoid freezing of the system cooling circuit.

In a further example of the method of the invention, in the event of failure of the main pump, the magnetic resonance examination system is switched from its imaging mode to its stand-by mode in which the back-up pump is switched on. Optionally, the back-up pump may be switched on and the switch-off valve is left open so that some cooling capacity is provided for the cooling clients, and some imaging functions could remain, albeit at a lower performance than in the imaging mode. In this situation the He-compressor remains running, so that due to the back-end cooling fluid moving and heat being supplied by the He-compressor, freezing of the back-end cooling fluid is counteracted.

These and other aspects of the invention will be elucidated with reference to the embodiments described hereinafter and with reference to the accompanying drawing wherein

DETAILED DESCRIPTION OF THE EMBODIMENTS

Figure 1:
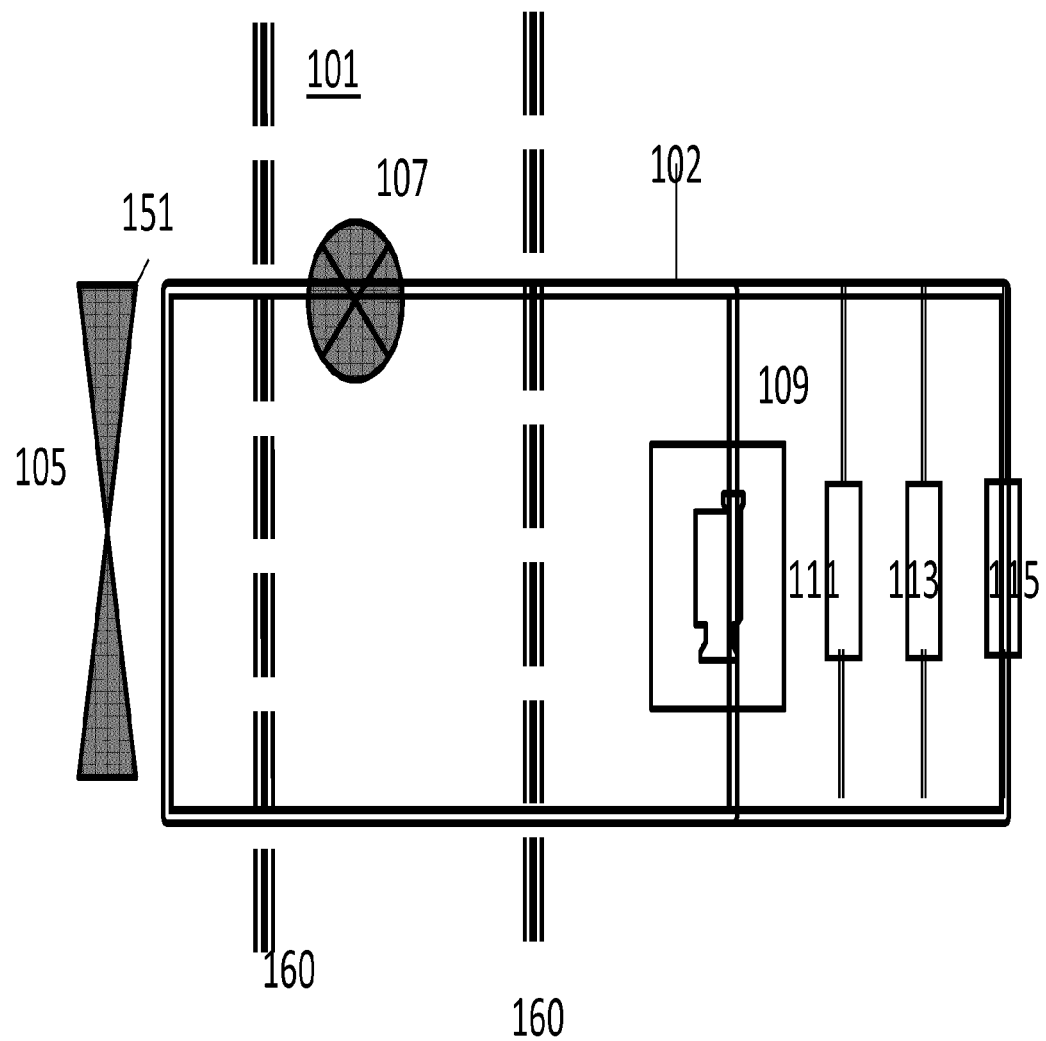
FIG. 1 diagrammatically shows an example of the magnetic resonance examination system's cooling arrangement.

FIG. 1 diagrammatically shows an example of the magnetic resonance examination system's cooling arrangement. The system cooling circuit 101 includes channels 102, in which the back-end cooling fluid flows, driven by the main pump 107. The system cooling circuit takes up heat from the cooling clients 113,115,115 and carries-off the heat to the heat drain 105. The heating clients are for example the gradient coils 12, gradient amplifier 21 or the radio frequency (RF) amplifier 15 of the magnetic resonance examination system. Any equipment of the magnetic resonance examination system that produces heat when in operation and is to be cooled can function as a cooling client in the framework of this invention. A fan 151 is provided to enhance heat transfer from the cooling fluid in the system cooling circuit to the heat drain 105, such as ambient or outside air. At temperatures below the range of 15-20 C, the system cooling circuit is usually able to main the cooling clients at their operating temperature of about 25 C. Further, the system cooling circuit is in thermal correspondence with a heat source 109. The heat drain, ambient or outside or outdoor air 105 may be at temperatures that are lower than the freezing point of the cooling fluid. This may be the case when the system cooling circuit is, for a part, located outside the building in which the magnetic resonance examination system is sited. Because the back-end cooling fluid is heated by the heat source 109, even when the magnetic resonance examination system is in stand-by and the cooling clients, such as the gradient coils, gradient amplifiers and RF amplifier are not active, and the back-end cooling fluid is circulated driven by the main pump 107, it is avoided that the system cooling circuit freezes. Accordingly, there is no need to apply e.g. glycol-based, antifreeze which would reduce the heat capacity and increase the viscosity of the cooling fluid in the system cooling circuit. Thus, the invention enables a lower performance, pumping power and flow, of the main pump. For example, dependent on temperature, the viscosity of water-glycol mixtures is about 2-3 times higher than the viscosity of water. Accordingly, the invention enables that the pressure drop over the cooling clients in the system cooling circuit is about a factor of 3 less than when antifreeze is employed.

Figure 2:
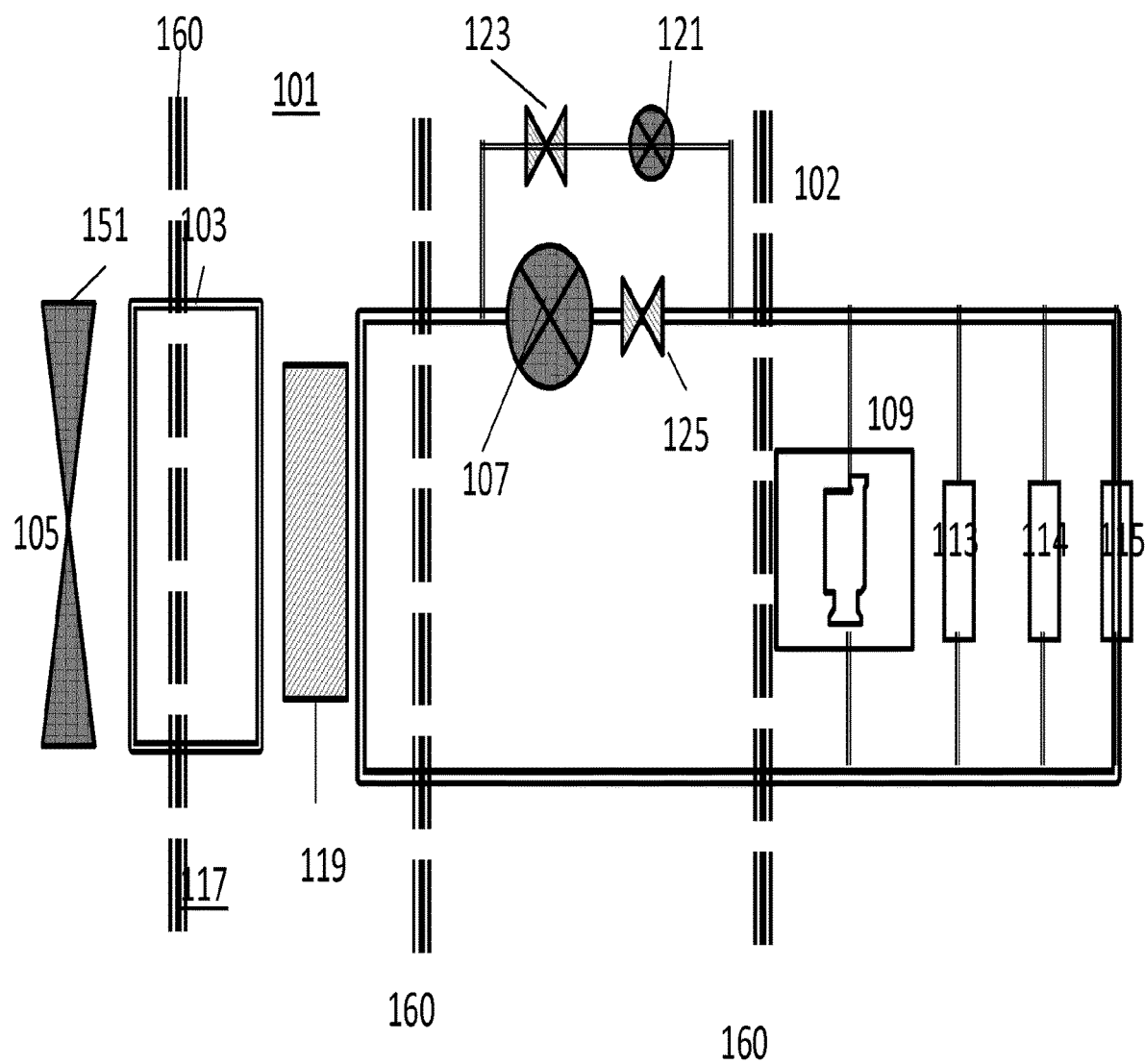
FIG. 2 diagrammatically shows a more advanced example of the magnetic resonance examination system's cooling arrangement.

FIG. 2 diagrammatically shows a more advanced example of the magnetic resonance examination system's cooling arrangement. In the example of FIG. 2, a chiller 117 with a chiller cooling circuit 103 is provided that has channels in which the front end cooling fluid circulates. The chiller is in thermal contact with the heat drain, e.g. ambient or outside air. The fan 151 is disposed at the chiller to enhance heat transfer from the front-end cooling fluid to ambient or outside air. The chiller cooling circuit and the system cooling circuit are in thermal correspondence by a heat exchanger 119. In this example, a back-up pump 121 is provided in parallel to the main pump to pump the back-end cooling fluid in the system cooling circuit 102. The back-up pump 121 only needs sufficient capacity to keep the cooling liquid in motion when the magnetic resonance examination system is not in its imaging mode and no heat is to be carried-off from the cooling clients 113,115,117. Thus, the magnetic resonance examination system does not rely on the main pump 107 to keep the back-end cooling fluid moving, take up heat from the heat source 109 and avoid freezing of the system cooling liquid, even at very low outside temperature. Thus, this example of the invention allows the magnetic resonance examination system to be sited such that the system cooling circuit is partly outside the building, or otherwise could be at low temperatures below the freezing point of the cooling fluid. Further, the main pump 107 is provided with a non-return valve 125 and the back-up pump 121 is provided with a non-return valve 123. The non-return valves arrange for the fluid-flow to remain unidirectional even if one or both pumps are off.

The heat source 109 may be a part of the magnetic resonance examination system's equipment that when in operation produces heat. For example the heat source 109 may be formed by the He-compressor, that remains in operation when the magnetic resonance examination system is not in its imaging mode, i.e. in the magnetic resonance examination system's stand-by the He-compressor remains operative to keep the main coil windings below their superconductivity critical temperature. The heat source as formed by the cryocooler's He-compressor is in fact also a cooling client. Alternatively, the function of the heat source may be performed by any of the cooling clients 113,115,117 by leaving them on, even if no imaging is done. Further, a separate back-up heat can be provided, that may back-up the heat source 109.

In FIGS. 1 and 2, optional locations for the outside wall 160 of the building are schematically indicated. The fan 151 will be outside and the main pump may either be inside or outside. Part of the chiller 117 may be outside as well as the parallel arrangement of the main pump and the system back-up pump.

Figure 3:
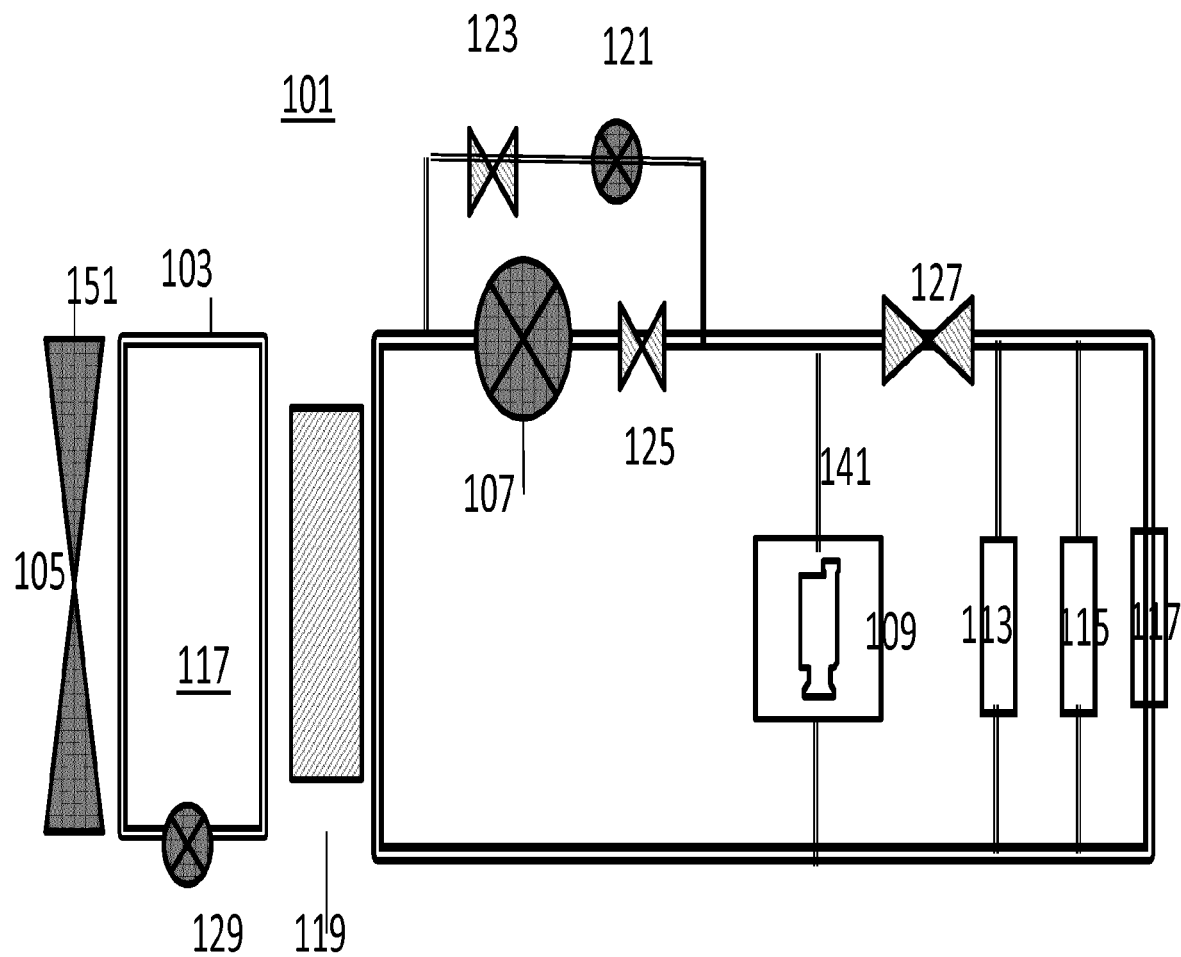
FIG. 3 diagrammatically shows a more sophisticated example of the magnetic resonance examination system's cooling arrangement and FIG. 4 shows a schematic representation of a magnetic resonance examination system in which the invention is employed.
Figure 4:
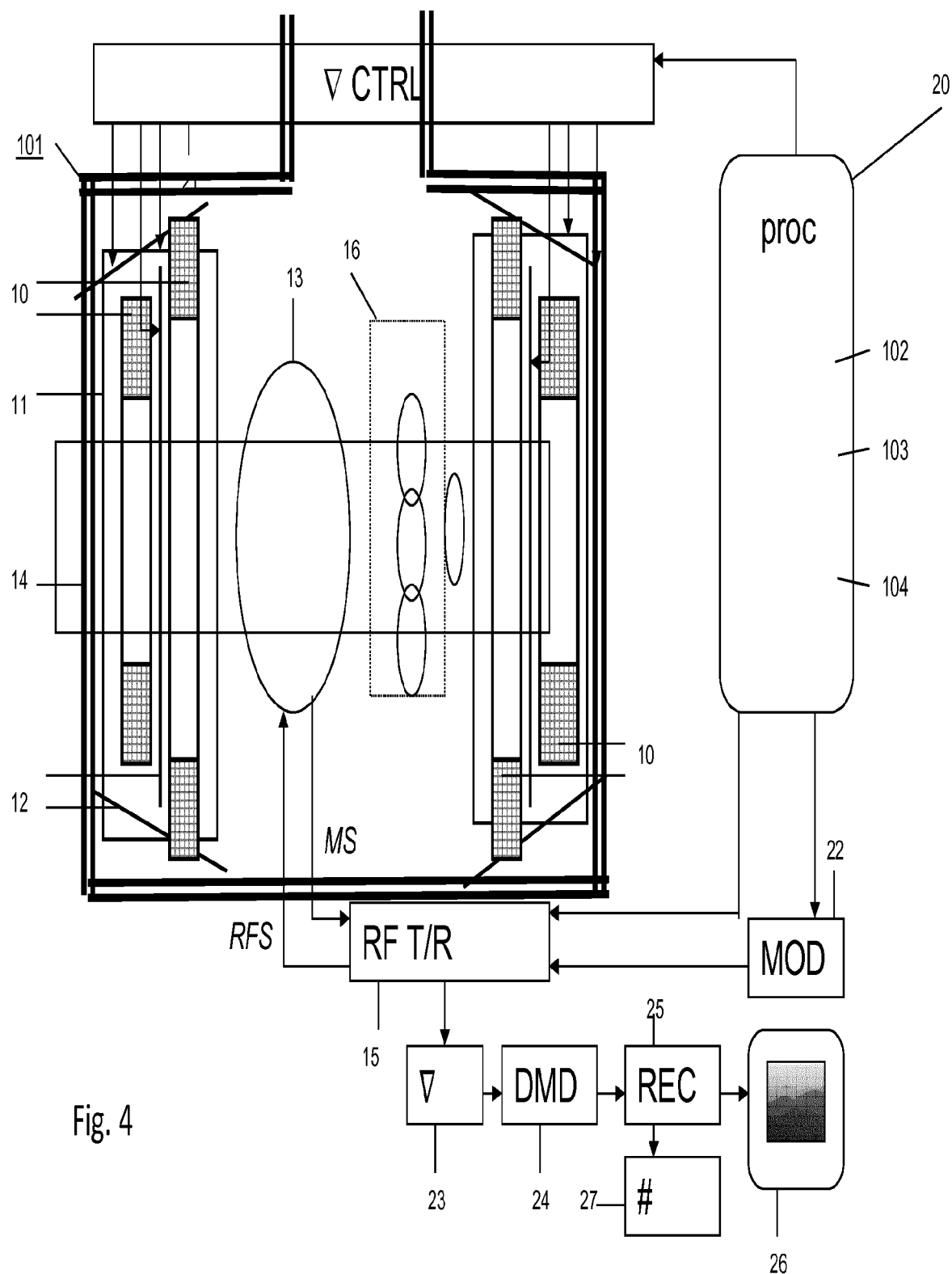

FIG. 3 diagrammatically shows a more sophisticated example of the magnetic resonance examination system's cooling arrangement. The embodiment of the cooling arrangement is provided with a short-circuit 141 and a shut-off valve 127. When the magnetic resonance examination system is in its stand-by mode no cooling of the cooling clients is needed, the shut-off valve is closed and the cooling liquid flows only via the short-circuit 141 via the heat source, e.g. the He-compressor. In this way a lower amount of fluid needs to be pumped in the magnetic resonance examination system's stand-by mode. In this embodiment the back-up pump 121 is provided with its non-return-valve 123 in the short-circuit 141. The non-return-valves 123 and 125 avoid that parasitic flow paths could occur. FIG. 4 shows a schematic representation of a magnetic resonance examination system in which the invention is employed. The magnetic resonance imaging system includes a main magnet with a set of main coils 10 whereby the steady, uniform magnetic field is generated. The main coils are constructed, for example in such a manner that they from a bore to enclose a tunnel-shaped examination space. The patient to be examined is placed on a patient carrier which is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a gradient control 21 which includes one or more gradient amplifier and a controllable power supply unit. The gradient coils 11, 12 are energised by application of an electric current by means of the power supply unit 21; to this end the power supply unit is fitted with electronic gradient amplification circuit that applies the electric current to the gradient coils so as to generate gradient pulses (also termed 'gradient waveforms') of appropriate temporal shape. The strength, direction and duration of the gradients are controlled by control of the power supply unit. The magnetic resonance imaging system also includes transmission and receiving antennae (coils or coil arrays) 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is generally used alternately as the transmission coil and the receiving coil. Typically, a receiving coil includes a multiplicity of elements, each typically forming a single loop. Various geometries of the shape of the loop and the arrangement of various elements are possible The transmission and receiving coil 13 is connected to an electronic transmission and receiving circuit 15.

It is to be noted that is that there is one (or a few) RF antenna elements that can act as transmit and receive; additionally, typically, the user may choose to employ an application-specific receive antenna that typically is formed as an array of receive-elements. For example, surface coil arrays 16 can be used as receiving and/or transmission coils. Such surface coil arrays have a high sensitivity in a comparatively small volume. The receiving coil is connected to a preamplifier 23. The preamplifier 23 amplifies the RF resonance signal (MS) received by the receiving coil 16 and the amplified RF resonance signal is applied to a demodulator 24. The receiving antennae, such as the surface coil arrays, are connected to a demodulator 24 and the received pre-amplified magnetic resonance signals (MS) are demodulated by means of the demodulator 24. The pre-amplifier 23 and demodulator 24 may be digitally implemented and integrated in the surface coil array. The demodulated magnetic resonance signals (DMS) are applied to a reconstruction unit. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. In particular the surface receive coil arrays 16 are coupled to the transmission and receive circuit by way of a wireless link. Magnetic resonance signal data received by the surface coil arrays 16 are transmitted to the transmission and receiving circuit 15 and control signals (e.g. to tune and detune the surface coils) are sent to the surface coils over the wireless link.

The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction is applied to a monitor 26, so that the reconstructed magnetic resonance image can be displayed on the monitor. It is alternatively possible to store the signal from the reconstruction unit 25 in a buffer unit 27 while awaiting further processing or display.

The magnetic resonance imaging system according to the invention is also provided with a control unit 20, for example in the form of a computer which includes a (micro) processor. The control unit 20 controls the execution of the RF excitations and the application of the temporary gradient fields. To this end, the computer program according to the invention is loaded, for example, into the control unit 20 and the reconstruction unit 25.

The invention claimed is:
1. A magnetic resonance examination system comprising:
a cooling client;
a system cooling circuit in thermal correspondence with the cooling client and in thermal correspondence with a heat drain; including:
a main pump arranged in the system cooling circuit to drive fluid flow in the system cooling circuit, wherein a heat source is arranged in thermal correspondence with the system cooling circuit, a shut-off valve in the system cooling circuit and upstream or downstream of the cooling client, wherein the system cooling circuit has a short-circuit parallel to the shut-off valve and a heat source is arranged in thermal correspondence with the short-circuit, and a system back-up pump circuited in parallel to the main pump in the system fluid cooling circuit to drive fluid flow in the system fluid cooling circuit, wherein when the magnetic resonance system is in an imaging mode, the main pump is configured to drive fluid flow in the system cooling circuit and when the magnetic resonance system is in a stand-by mode the system back-up pump is configured to drive fluid flow in the system cooling circuit.

2. The magnetic resonance examination system of claim 1, further including a chiller with a front-end fluid cooling circuit in thermal correspondence with the heat drain and a heat exchanger arranged between the chiller and the system cooling circuit establishing thermal correspondence between the chiller and the system cooling circuit.

3. The magnetic resonance examination system of claim 1, wherein the system cooling circuit contains a low-viscosity high heat capacity cooling fluid.

4. The magnetic resonance examination system of claim 1, further including a back-up heater in thermal correspondence with the system cooling circuit.

5. The method of cooling of a cooling client in an magnetic resonance examination system of claim 4, having an imaging mode and stand-by mode, wherein in the imaging mode the main pump is switched on wherein in the event of a heat fault mode of the magnetic resonance examination system in which the heat source fails, the back-up heater is switched-on.

6. A method of operating the cooling of the cooling client in an magnetic resonance examination system having an imaging mode and stand-by mode, wherein the system includes: a cooling client; a system cooling circuit in thermal correspondence with the cooling client and in thermal correspondence with a heat drain; including: a main pump arranged in the system cooling circuit to drive fluid flow in the system cooling circuit wherein a heat source is arranged in thermal correspondence with the system cooling circuit a shut-off valve in the system cooling circuit and upstream or downstream of the cooling client and the system cooling system circuit has a short-circuit parallel to the shut-off valve and a heat source is arranged in thermal correspondence with the short-circuit, the method comprising:

in the imaging mode the main pump is switched on and the back-up pump is switched off and in the stand-by mode the main pump is switched-off and the system back-up pump is switched-on.

7. The method of cooling of a cooling client as claimed in claim 6, wherein in the event of a heat fault mode of the magnetic resonance examination system in which the heat source fails, the main pump and the back-up pump are operated in the stand-by mode and optionally one of the cooling clients is switched-on.

8. The method of cooling of a cooling client as claimed in claim 6, wherein in the event of a back-up fault mode in which the system back-up pump fails, the magnetic resonance examination system is switched from its stand-by mode to its imaging mode in which the main pump is switched on, and optionally one or more cooling clients are activated to produce sufficient heat to avoid freezing of the system cooling circuit.

9. The method of cooling of a cooling client of claim 6, wherein in the event of a main pump fault mode in which the main pump fails, the magnetic resonance examination system is switched to its standby mode in which the back-up pump is switched on.

* * * * *